United States Patent [19]
Chen et al.

[11] Patent Number: 6,110,232
[45] Date of Patent: Aug. 29, 2000

[54] METHOD FOR PREVENTING CORROSION IN LOAD-LOCK CHAMBERS

[75] Inventors: Jia Rong Chen; Wen Chyi Wang; Long Hoang Peng, all of Hsin-Chu, Taiwan

[73] Assignee: Taiwan Semiconductor Manufacturing Company, Ltd., Hsin Chu, Taiwan

[21] Appl. No.: 09/164,919

[22] Filed: Oct. 1, 1998

[51] Int. Cl.[7] .............................. H01L 21/00; H01L 21/64
[52] U.S. Cl. ........................................... 29/25.01; 438/908
[58] Field of Search ........................ 204/298.25, 248.26, 204/298.35; 438/908; 29/25.01; 118/719

[56] References Cited

U.S. PATENT DOCUMENTS 4,592,306  6/1986  Gallego .
5,135,608  8/1992  Okuani .

*Primary Examiner*—David E. Graybill
*Attorney, Agent, or Firm*—Tung & Associates

[57] ABSTRACT

A method for preventing corrosion in a load-lock chamber used in a cluster-type wafer processing system by utilizing an additional degas chamber and by the execution of an additional degas operation is provided. In the method, a degas chamber which is equipped with a purge gas inlet and a purge gas outlet directed at a wafer surface positioned in the degas chamber is used. The wafer is degassed by a purge gas of $N_2$, $O_2$ or any other suitable gas prior to being transferred back to a load-lock chamber. A suitable purge gas flow rate between about 100 sccm and about 5,000 sccm is used to effectively purge away undesirable, residual process gas from the surface of a wafer. In an alternate embodiment, the purge gas of $N_2$ or $O_2$ may be preheated to at least 30° C. to improve the efficiency of purging. In another alternate embodiment, the wafer itself may be heated in the degas chamber to a temperature of between about 100° C. and about 250° C. during the degassing operation such that undesirable residual corrosive gas may be more efficiently removed in a shorter time period.

29 Claims, 2 Drawing Sheets

METHOD FOR PREVENTING CORROSION IN LOAD-LOCK CHAMBERS

FIELD OF THE INVENTION

The present invention generally relates to a method for processing a wafer in a cluster-type wafer fabrication system and more particularly, relates to a method for preventing corrosion in a load-lock chamber in a cluster-type fabrication system by removing corrosive gases from the surface of a wafer prior to positioning the wafer into the load-lock chamber.

BACKGROUND OF THE INVENTION

In the fabrication process for a semiconductor device, numerous processing steps must be performed on a semiconducting substrate to form various circuits. The process may consist of as many as several hundred processing steps. Each processing step is executed in a process chamber such as an etcher, a physical vapor deposition chamber (PVD), a chemical vapor deposition chamber, etc.

In the vast majority of the processing steps, a special environment of either a high vacuum, a low vacuum, a gas plasma or other chemical environment must be provided for the process. For instance, in a PVD (or sputter) chamber, a high vacuum environment must first be provided that surrounds the wafer such that particles sputtered from a metal target can travel to and deposit on an exposed surface of the wafer. In other process chambers, such as in a plasma enhanced chemical vapor deposition chamber (PECVD), a plasma cloud of a reactant gas or gases is formed over a wafer positioned in a chamber such that deposition of a chemical substance can occur on the wafer. During any processing step, the wafer must also be kept in an extremely clean environment without the danger of being contaminated. The processing of a wafer therefore is normally conducted in a hermetically sealed environment that is completely isolated from the atmosphere. Numerous processing equipment has been provided for such purpose. One of such widely used cluster-type fabrication equipment is marketed by the Applied Materials Corporation of Santa Clara, Calif., i.e., the Centura® 5000 system.

In a typical Centura® 5000 cluster-type wafer handling system, as shown in FIG. 1, the basic system 10 consists of two independent vacuum cassette load-locks 12 and 14, a capacity for one to four independent process chambers (two of such chambers 16 and 18 are shown in FIG. 1), a capacity for two service chambers which includes an orienter 22, and a vacuum transfer chamber 20 which is isolated from vacuum cassette load locks 12, 14 and process chambers 16, 18 by slit valves (not shown). The modular design of the basic system 10 is such that up to three high-temperature deposition chambers may be installed in the system. The basic system 10 can be used for fully automatic high-throughput processing of wafers by utilizing a magnetically coupled robot. The basic system 10 is further capable of transferring wafers which are maintained at a temperature as high as 700° C. The basic system 10 also allows cross-chamber pressure equalization and through-the-wall factory installation. The vacuum pumps for the process chambers 16, 18, the transfer chamber 20 and the cassette load-locks 12, 14 are mounted at a remote location to prevent mechanical vibration from affecting the operation of the system.

The vacuum cassette load-locks 12, 14, the process chambers 16, 18 and the orienter 22 are bolted to the vacuum transfer chamber 20 and are self-aligned for ease of expansion or modification. Each of the process chambers 16, 18 is capable of processing a single wafer for achieving wafer-to-wafer repeatability and control. The temperatures in the process chambers 16, 18 are controlled in a closed-loop circuit for accuracy.

A plane view of the basic system 10 of FIG. 1 is shown in FIG. 2. In the basic wafer processing system 10 shown in FIGS. 1 and 2, the transporting of wafers between the various load-lock chambers 12, 14, the process chambers 16, 18 and the orienter 22 must be carefully conducted to avoid damages from occurring to the wafers. To accomplish such task, the wafer is transported by a wafer transfer system 24. The wafer transfer system 24 consists mainly of a robotic handler which handles all wafer transfers by a single, planar, two-axis, random access, cassette-to-cassette motion. A magnetically coupled robot permits good vacuum integrity and service without interrupting chamber integrity. The major component of the wafer transfer system 24 is a robot blade 28. The robot blade 28 permits high-temperature transfer of wafers without incurring contamination. A non-contact optical wafer centering process is also performed during the wafer transfer process. A constant flow of filtered inert gas such as nitrogen is used in the cassette load-locks 12, 14 and the vacuum transfer chamber 20. A conventional robot blade 28 can be fabricated of a non-magnetic type metal such as aluminum.

One of the process chambers 16, 18 is frequently used as an etch chamber for performing an etching process on a wafer. For instance, when the formation of alignment marks on the surface of a wafer is necessary, an etching process utilizing a corrosive gas is used for etching the marks (or holes) in the wafer surface. The surface layer etched may be a polysilicon layer. After he completion of the etching process, the robot blade 28 transfers the etched wafer from the etch chamber back into one of the load-lock chambers 12, 14. When such direct transfer of wafers between an etch chamber and a load-lock chamber occurs, a small amount of residual corrosive gas that was left on the surface of the wafer is frequently carried into the load-lock chamber. While the amount of residual corrosive gas left on a single wafer does not present a corrosive problem to a load-lock chamber, the total amount of corrosive gas carried by as many as 25 wafers stored in a wafer cassette situated in the load-lock chamber produces a cumulative effect and causes a serious corrosion problem on the components in the load-lock chamber.

Most components in a load-lock chamber are fabricated of metal which is susceptible to corrosion by an etching gas such as $Cl_2$ or F. For instance, the components include a stainless steel bellow which is constructed in a corrugated structure and thus any result of corrosion such as holes formed through the bellow is difficult to detect. Other components such as an aluminum base used in the load-lock chamber is also subjected to the corrosive effect of $Cl_2$ or F. A SMIF arm made of metal that reaches into the load-lock chamber for loading or unloading a wafer and various metal fasteners used on the arm are also subjected to corrosion when contacted frequently by the corrosive gases.

It is therefore an object of the present invention to provide a method for preventing corrosion in a load-lock chamber used in a cluster-type wafer fabrication system that does not have the drawbacks or shortcomings of the conventional method.

It is another object of the present invention to provide a method for preventing corrosion in a load-lock chamber incorporated in a cluster-type wafer fabrication system by adding an additional degas chamber to the fabrication system.

It is a further object of the present invention to provide a method for preventing corrosion in a load-lock chamber that is used in a cluster-type wafer fabrication system by first transferring an etched wafer to a degas chamber prior to transferring of the wafer back into the load-lock chamber.

It is another further object of the present invention to provide a method for preventing corrosion in a load-lock chamber that is used in a cluster-type wafer fabrication system when wafers are processed in an etch chamber by corrosive gases such as $Cl_2$ or F.

It is still another object of the present invention to provide a method for preventing corrosion in a load-lock chamber that is used in a cluster-type wafer fabrication system by purging a surface of an etched wafer in a degas chamber by a purge gas of $N_2$ or $O_2$.

It is yet another object of the present invention to provide a method for preventing corrosion in a load-lock chamber that is used in a cluster-type wafer fabrication system by purging a surface of the wafer in a degas chamber with a purge gas at a flow rate between about 100 sccm and about 5,000 sccm.

It is still another further object of the present invention to provide a method for preventing corrosion in a load-lock chamber that is used in a cluster-type wafer fabrication system by purging the surface of an etched wafer with a purge gas until substantially all residual corrosive gas has been removed from the surface of the wafer.

It is yet another further object of the present invention to provide a method for preventing corrosion in a load-lock chamber that is used in a cluster-type wafer fabrication system by purging the surface of a processed wafer with a purge gas of either $N_2$ or $O_2$ for a length of time of about 30 seconds to substantially remove all residual corrosive gas from the wafer.

SUMMARY OF THE INVENTION

In accordance with the present invention, a method for preventing corrosion in a load-lock chamber that is used in a cluster-type wafer fabrication system by adding a degas chamber to the cluster system is provided.

In a preferred embodiment, a method for preventing corrosion in a load-lock chamber included in a cluster-type wafer fabrication system can be carried out by the operating steps of first removing a wafer after processed by a corrosive gas from a process chamber; then positioning the wafer which has residual corrosive gas on a top surface in a degas chamber; then flowing a purge gas into the degas chamber at a flow rate sufficient for removing the residual corrosive gas on the wafer; and transferring the wafer from the degas chamber to the load-lock chamber.

The method may further include the step of removing the wafer after it is processed in an etch chamber, or removing the wafer after a polysilicon etching process. The method may further include the step of etching the wafer by an etchant gas which includes at least one gas selected from $Cl_2$ and F prior to the wafer removal step. The method may further include the step of etching alignment marks in a polysilicon layer by $Cl_2$ prior to the step of removing the wafer after it is processed by a corrosive gas. The method may still further include the step of mounting a degas chamber to a cluster fabrication system juxtaposed to a load-lock chamber prior to the step of positioning the wafer in the degas chamber.

The method for preventing corrosion in a load-lock chamber may further include the step of equipping the degas chamber with a gas flow control apparatus for producing a gas flow rate of between about 10 sccm and about 5,000 sccm. The purged gas used may be $N_2$. The purge gas used may be $N_2$ for flowing over the top surface of the wafer at a flow rate of between about 100 sccm and about 1,000 sccm. The purge gas may be $N_2$ for flowing over the top surface of the wafer at a flow rate of about 750 sccm for about 30 seconds. The purge gas may also be a heated $N_2$ at a temperature of at least 30° C. The purged gas used may further be $O_2$ for flowing over the top surface of the wafer at a flow rate of between about 100 sccm and about 5,000 sccm. The purge gas may also be at least one gas selected from the group consisting of $N_2$, He, Ar and $O_2$.

In another preferred embodiment, the present invention method for preventing corrosion in a load-lock chamber after a wafer etching process may be carried out by the steps of first providing a cluster-type wafer fabrication system for wafer processing which includes an etch chamber, a degas chamber, and a load-lock chamber; then conducting an etching process on a wafer in the etch chamber utilizing a corrosive etchant gas; then removing the wafer which has residual corrosive gas on top out of the etch chamber; then positioning the wafer in the degas chamber which is equipped with a purge gas inlet; then flowing a purge gas through the purge gas inlet of the degas chamber over the top of the wafer for a sufficient length of time such that substantially all residual corrosive gas is removed; and then transferring the wafer from the degas chamber to the load-lock chamber.

The method for preventing corrosion in a load-lock chamber may further include the step of etching alignment marks in a polysilicon layer on the wafer. The method may further include the step of etching the wafer by an etchant gas of $Cl_2$ or F. The cluster-type wafer fabrication system may further include at least one deposition chamber. The method may further include the step of flowing the purge gas over the top of the wafer at a flow rate sufficient for removing substantially all the residual corrosive gas on the wafer. The method may further include the step of flowing a purge gas of $N_2$ into the degas chamber at a flow rate between about 100 sccm and about 1,000 sccm. The sufficient length of time for flowing the purge gas over the top of the wafer is about 30 seconds when a flow rate for the purged gas is between about 500 sccm and about 1,000 sccm.

The method may further include the step of flowing a purge gas of $O_2$ into the degas chamber at a flow rate between about 100 sccm and about 5,000 sccm. The purge gas may be at least one gas selected from the group consisting of $N_2$, He, Ar and $O_2$. The purge gas may be heated to a temperature of at least 30° C. The wafer when positioned in the degas chamber may be heated to a temperature of not less than 100° C., or to a temperature of between about 100° C. and about 250° C. The method may further include the step of transferring the wafer from the degas chamber to a cool-down chamber prior to transferring to the load-lock chamber. The method may further include the step of providing a purge gas outlet in fluid communication with the purge gas inlet positioned in the degas chamber. The method may further include the step of positioning the purge gas outlet at a distance from a top surface of the wafer of not more than 5 cm.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention provides a method for preventing corrosion in a load-lock chamber that is used in a cluster-type wafer fabrication system by adding an additional degas chamber to the cluster and by executing a degassing operation before a wafer is transferred from an etch chamber back into a load-lock chamber.

Figure 1:
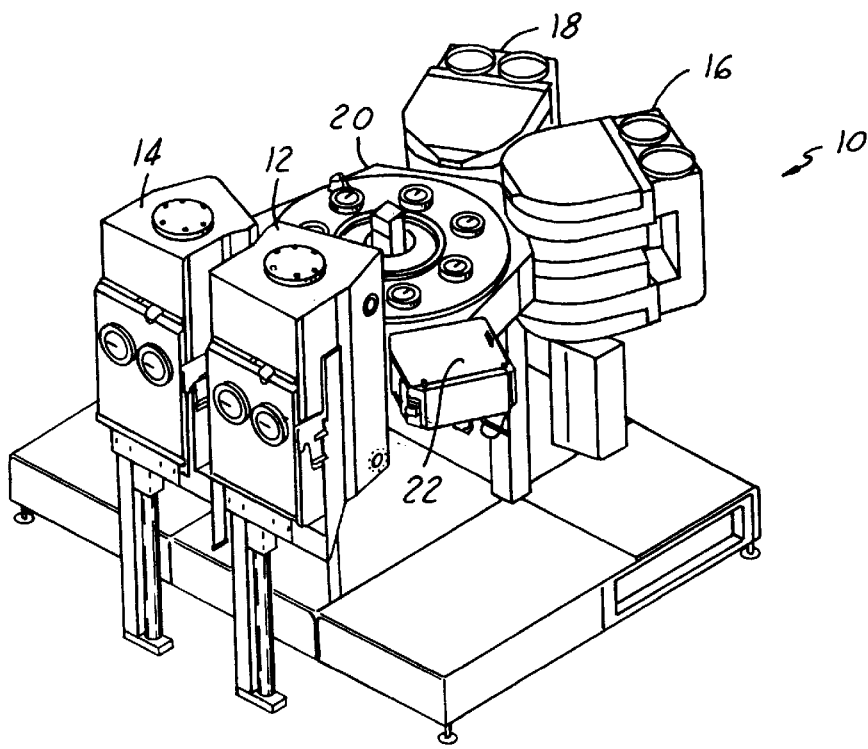
FIG. 1 is a perspective view of a conventional cluster-type wafer fabrication system.
Figure 2:
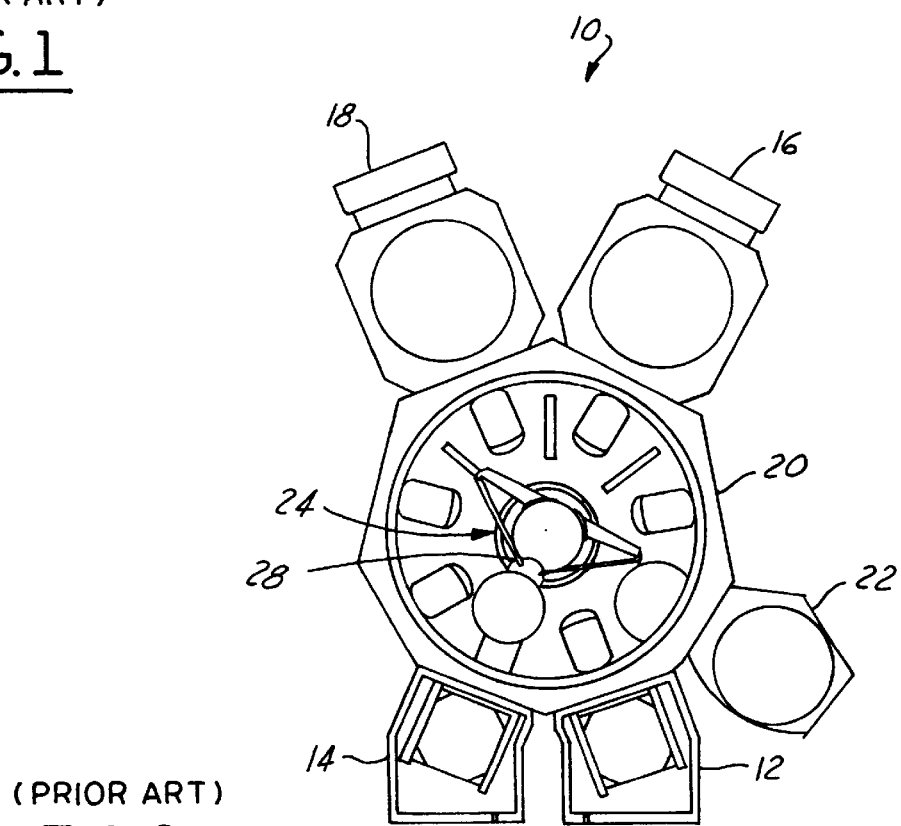
FIG. 2 is a plane view of the conventional cluster-type wafer fabrication system of FIG. 1.

In the operation of a cluster-type wafer fabrication system, a wafer is first transferred from a load-lock chamber to an orienter 22 (FIG. 2) to locate the wafer flat side and the wafer center. After the wafer is properly oriented, it is transferred to a process chamber, i.e., an etch chamber for carrying out an etching process, or any other process such as CVD or PVD. When a high process temperature is used, i.e., at about 250° C., a cool-down chamber may be required for cooling down the wafer before it is transferred back into the load-lock chamber.

In carrying out an etching process, i.e., one that forms alignment marks or holes in a polysilicon layer on a wafer, a corrosive gas such as $Cl_2$ or F is frequently used either alone or in an etchant gas mixture. The etching process may also be carried out in a metal layer, in a nitride layer or in an oxide layer. When the corrosive etchant gas is used, residual corrosive gas stays on a top surface of the wafer during and after the transfer from an etch chamber into a load-lock chamber. The small amount of the residual corrosive gas carried by a single wafer does not normally present a corrosive problem for the components in the load-lock chamber. However, when a full cassette of wafers which is normally carried in a load-lock chamber, i.e., 25 wafers, are present and each having residual corrosive gas on top, the cumulative effect of the corrosive gas may cause serious corrosion problems for the components in the load-lock chamber. This is particularly serious when such interior components are fabricated of metal materials such as aluminum or stainless steel. The corrosion on the interior components in a load-lock chamber creates particles from a corroded surface layer of the metal leading to serious contamination problems in a subsequent process when wafers carrying such contaminating particles are positioned in another process chamber.

Figure 3:
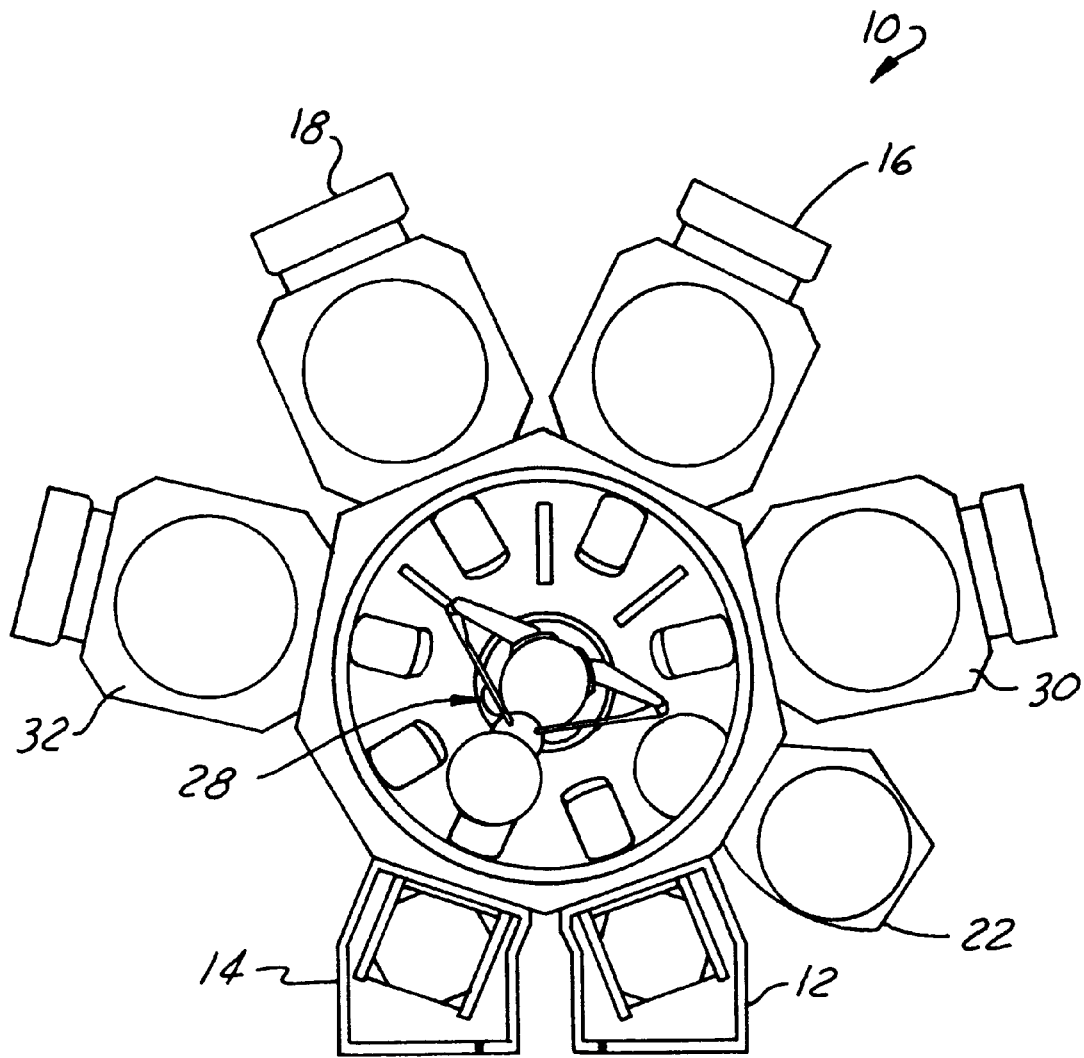
FIG. 3 is a plane view of the present invention cluster-type wafer fabrication system incorporating a degas chamber.

The present invention novel method of preventing corrosion in a load-lock chamber can be carried out by adding an additional degas chamber in the cluster-type wafer fabrication system. This is shown in FIG. 3. Process chambers 30, 32 are also present in the cluster-type wafer fabrication system 10. Either one of the process chambers 30, 32 may be used as a degas chamber for carrying out the present invention novel method.

The present invention method may be carried out in the following manner: first, a wafer is removed after being processed by a corrosive gas from the process chamber 16 or 18. The wafer which has residual corrosive gas on top is then positioned in a degas chamber 30 or 32. A purge gas is then flown into the degas chamber 30, or 32 at a flow rate sufficient to remove the residual corrosive gas on the wafer surface. The wafer is then transferred from the degas chamber to the load-lock chamber.

To degas the surface of a wafer of residual etchant gas of $Cl_2$ or F, a purge gas is normally used which may be $N_2$ or $O_2$. Other suitable purge gases may also be utilized which includes other inert gases such as He and Ar. The flow rate for the purge gas flown into the degas chamber through a purge gas inlet may be between about 10 sccm and about 5,000 sccm. The purge gas may exit a purge gas outlet which is in fluid communication with the purge gas inlet that is directed at the top surface of the wafer. The purge gas outlet may be positioned, preferably, at a small distance away from the top surface of the wafer, i.e., at less than 5 cm, and preferably at less than 3 cm.

When the purge gas utilized is $N_2$, a suitable flow rate may be between about 100 sccm and about 1,000 sccm. A suitable purge time for flowing the purge gas on top of the wafer may be between about 20 seconds and about 60 seconds, and preferably about 30 seconds. The purge gas of $N_2$ for flowing over the top surface of the wafer at a predetermined flow rate of about 750 sccm is about 30 seconds.

In an alternate embodiment, a purge gas of $N_2$ may be pre-heated to a temperature of at least 30° C. It has been found that a heated purge gas is more effective in removing a residual corrosive gas from the surface of a wafer.

In another alternate embodiment, the purge gas utilized may be $O_2$ for flowing over the top surface of a wafer at a flow rate between about 100 sccm and about 5,000 sccm. While other purge gases may also be suitably used which includes at least one gas selected from the group consisting of He and Ar.

In still another alternate embodiment, the wafer when positioned in the degas chamber may be preheated to a temperature of not less than 100° C., and preferably between about 100° C. and about 250° C. A heated wafer may further improve the efficiency of residual corrosive gas removal from the surface of a wafer. When a wafer is heated to a higher than ambient temperature, specifically when a wafer is heated to a temperature of higher than 200° C., the method may further include the step of transferring the wafer from the degas chamber to a cool-down chamber prior to transferring the wafer to the load-lock chamber.

In yet another alternate embodiment, the present invention method may include the step of providing a purge gas outlet or nozzle in fluid communication with the purge gas inlet positioned in the degas chamber. The purge gas outlet or nozzle may suitably be positioned in the degas chamber toward the top surface of the wafer at a distance of not more than 5 cm, and preferably at a distance of not more than 3 cm.

The present invention novel method has been amply described in the above descriptions and in the appended drawing of FIG. 3. It should be noted that while an etching process is used to illustrate the present invention method, the method is in no way limited to only an etching process. As long as there is undesirable, residual corrosive process gas left on the surface of a wafer, the present invention degassing step may be used to remove such undesirable gas from the surface of the wafer prior to its transfer into another chamber.

While the present invention has been described in an illustrative manner, it should be understood that the terminology used is intended to be in a nature of words of description rather than of limitation.

Furthermore, while the present invention has been described in terms of a preferred embodiment and several alternate embodiments, it is to be appreciated that those skilled in the art will readily apply these teachings to other possible variations of the inventions. The embodiment of the invention in which an exclusive property or privilege is claimed are defined as follows:

What is claimed is:

1. A method for preventing corrosion in a load-lock chamber incorporated in a cluster-type wafer fabrication system comprising the steps of:

removing a wafer after processed by a corrosive gas from a process chamber, positioning said wafer having residual corrosive gas on a top surface in a degas chamber, flowing a purge gas into said degas chamber at a flow rate sufficient to remove said residual corrosive gas on said wafer, and transferring said wafer from said degas chamber to said load-lock chamber.

2. A method for preventing corrosion in a load-lock chamber incorporated in a cluster-type wafer fabrication system according to claim 1 further comprising the step of removing said wafer after processed in an etch chamber.

3. A method for preventing corrosion in a load-lock chamber incorporated in a cluster-type wafer fabrication system according to claim 1 further comprising the step of removing said wafer after a polysilicon etching process.

4. A method for preventing corrosion in a load-lock chamber incorporated in a cluster-type wafer fabrication system according to claim 1 further comprising the step of etching said wafer by an etchant gas comprises at least one gas selected from the group consisting of $Cl_2$ and F prior to said wafer removal step.

5. A method for preventing corrosion in a load-lock chamber incorporated in a cluster-type wafer fabrication system according to claim 1 further comprising the step of etching alignment marks in a polysilicon layer by $Cl_2$ prior to said step of removing the wafer after processed by a corrosive gas.

6. A method for preventing corrosion in a load-lock chamber incorporated in a cluster fabrication system according to claim 1 further comprising the step of mounting said degas chamber to said cluster-type wafer fabrication system juxtaposed to a load-lock chamber prior to the step of positioning said wafer in a degas chamber.

7. A method for preventing corrosion in a load-lock chamber incorporated in a cluster-type wafer fabrication system according to claim 1 further comprising the step of equipping said degas chamber with a gas flow control apparatus for producing a gas flow rate between about 10 sccm and about 5,000 sccm.

8. A method for preventing corrosion in a load-lock chamber incorporated in a cluster-type wafer fabrication system according to claim 1, wherein said purge gas used is $N_2$.

9. A method for preventing corrosion in a load-lock chamber incorporated in a cluster-type wafer fabrication system according to claim 1, wherein said purge gas is $N_2$ for flowing over said top surface of the wafer at a flow rate between about 100 sccm and about 1,000 sccm.

10. A method for preventing corrosion in a load-lock chamber incorporated in a cluster-type wafer fabrication system according to claim 1, wherein said purge gas is $N_2$ for flowing over said top surface of the wafer at a flow rate of about 750 sccm for about 30 seconds.

11. A method for preventing corrosion in a load-lock chamber incorporated in a cluster-type wafer fabrication system according to claim 1, wherein said purge gas is heated $N_2$ at a temperature of at least 30° C.

12. A method for preventing corrosion in a load-lock chamber incorporated in a cluster-type wafer fabrication system according to claim 1, wherein said purge gas is $O_2$.

13. A method for preventing corrosion in a load-lock chamber incorporated in a cluster-type wafer fabrication system according to claim 1, wherein said purge gas is $O_2$ for flowing over said top surface of the wafer at a flow rate between about 100 sccm and about 5,000 sccm.

14. A method for preventing corrosion in a load-lock chamber incorporated in a cluster-type wafer fabrication system according to claim 1, wherein said purge gas is at least one gas selected from the group consisting of $N_2$, He, Ar and $O_2$.

15. A method for preventing corrosion in a load-lock chamber after a wafer etching process comprising the steps of:

providing a cluster-type wafer fabrication system for wafer processing which includes an etch chamber, a degas chamber and a load-lock chamber, conducting an etching process on a wafer in said etch chamber utilizing a corrosive etching gas, removing said wafer having residual corrosive gas on top out of said etch chamber, positioning said wafer in said degas chamber equipped with a purge gas inlet, flowing a purge gas through said purge gas inlet of said degas chamber over the top of said wafer for a sufficient length of time such that substantially all the residual corrosive gas is removed, and transferring said wafer from said degas chamber to said load-lock chamber.

16. A method for preventing corrosion in a load-lock chamber after a wafer etching process according to claim 15 further comprising the step of etching alignment marks in a polysilicon layer on said wafer.

17. A method for preventing corrosion in a load-lock chamber after a wafer etching process according to claim 15 further comprising the step of etching said wafer by an etchant gas of $Cl_2$ or F.

18. A method for preventing corrosion in a load-lock chamber after a wafer etching process according to claim 15, wherein said cluster fabrication system further comprising at least one deposition chamber.

19. A method for preventing corrosion in a load-lock chamber after a wafer etching process according to claim 15 further comprising the step of flowing said purge gas over the top of said wafer at a flow rate sufficient for removing substantially all the residual corrosive gas on said wafer.

20. A method for preventing corrosion in a load-lock chamber after a wafer etching process according to claim 15 further comprising the step of flowing a purge gas of $N_2$ into said degas chamber at a flow rate between about 100 sccm and about 1,000 sccm.

21. A method for preventing corrosion in a load-lock chamber after a wafer etching process according to claim 15, wherein said sufficient length of time for flowing said purge gas over the top of said wafer is about 30 seconds when a flow rate for said purge gas is between about 500 sccm and about 1,000 sccm.

22. A method for preventing corrosion in a load-lock chamber after a wafer etching process according to claim 15 further comprising the step of flowing a purge gas of $O_2$ into said degas chamber at a flow rate between about 100 sccm and about 5,000 sccm.

23. A method for preventing corrosion in a load-lock chamber after a wafer etching process according to claim 15, wherein said purge gas is at least one gas selected from the group consisting of $N_2$, He, Ar and $O_2$.

24. A method for preventing corrosion in a load-lock chamber after a wafer etching process according to claim 15, wherein said purge gas is heated to a temperature of at least 30° C.

25. A method for preventing corrosion in a load-lock chamber after a wafer etching process according to claim 15, wherein said wafer when positioned in said degas chamber is heated to a temperature of not less than 100° C.

26. A method for preventing corrosion in a load-lock chamber after a wafer etching process according to claim 15, wherein said wafer when positioned in said degas chamber is heated to a temperature between about 100° C. and about 250° C.

27. A method for preventing corrosion in a load-lock chamber after a wafer etching process according to claim 26 further comprising the step of transferring said wafer from said degas chamber to a cool-down chamber prior to said transferring step to said load-lock chamber.

28. A method for preventing corrosion in a load-lock chamber after a wafer etching process according to claim 15 further comprising the step of providing a purge gas outlet in fluid communication with said purge gas inlet positioned in said degas chamber.

29. A method for preventing corrosion in a load-lock chamber after a wafer etching process according to claim 28 further comprising the step of positioning said purge gas outlet at a distance from the top of the wafer of not more than 5 cm.

* * * * *